US008994433B2

United States Patent
Lin

(10) Patent No.: US 8,994,433 B2
(45) Date of Patent: Mar. 31, 2015

(54) METHOD AND APPARATUS FOR GENERATING ON-CHIP CLOCK WITH LOW POWER CONSUMPTION

(75) Inventor: Yijing Lin, Beijing (CN)

(73) Assignee: Analog Devices, Inc., Norwood, MA (US)

( * ) Notice: Subject to any disclaimer, the term of this patent is extended or adjusted under 35 U.S.C. 154(b) by 374 days.

(21) Appl. No.: 13/350,035

(22) Filed: Jan. 13, 2012

(65) Prior Publication Data

US 2013/0181760 A1    Jul. 18, 2013

(51) Int. Cl.
*G06F 1/04*    (2006.01)
*H03K 3/011*    (2006.01)
*H03K 3/0231*    (2006.01)

(52) U.S. Cl.
CPC .............. *H03K 3/0231* (2013.01); *H03K 3/011* (2013.01)
USPC .......................................... 327/293; 327/291

(58) Field of Classification Search
USPC .......................................... 327/291, 293, 294
See application file for complete search history.

(56) References Cited

U.S. PATENT DOCUMENTS 7,332,944 B2 *   2/2008   Fujita et al. ................... 327/113
7,746,130 B2 *   6/2010   Chang ........................... 327/131
7,911,252 B2 *   3/2011   Kondou ........................ 327/291

OTHER PUBLICATIONS

Junghyup Lee et al., "A 10MHz 80 μW 67 ppm/° C. CMOS Reference Clock Oscillator with a Temperature Compensated Feedback Loop in 0.18 μm CMOS," 2009 Symposium on VLSI Circuits, Digest of Technical Papers, pp. 226-227, Jun. 2009.
M. Kashmiri et al., "A Thermal-Diffusivity-Based Frequency Reference in Standard CMOS with an Absolute Inaccuracy of ±0.1% from -55° C. to 125° C.," IEEE International Solid-State Circuits Conference, ISSCC 2010, Digest of Technical Papers, pp. 74-75, Feb. 2010.

* cited by examiner

*Primary Examiner* — Hai L Nguyen
(74) *Attorney, Agent, or Firm* — Kenyon & Kenyon LLP

(57) ABSTRACT

A fully on-chip clock generator on an integrated circuit ("IC") includes a frequency detector for receiving a reference current and providing a first voltage; an error integrator for receiving the first voltage from the frequency detector, comparing it with a reference voltage, and providing a control voltage; a voltage controlled oscillator ("VCO") for receiving the control voltage from the error integrator, and providing an output clock; and a logic controller on the IC, coupled between the VCO and the frequency detector, and generating logic control signals for controlling the frequency detector. The fully on-chip clock generator requires no external crystal, but its power consumption is significantly lower than a relaxation oscillator that generates the same clock frequency.

25 Claims, 12 Drawing Sheets

METHOD AND APPARATUS FOR GENERATING ON-CHIP CLOCK WITH LOW POWER CONSUMPTION

BACKGROUND INFORMATION

The present invention relates to clock generation on integrated circuits (ICs). In particular, the invention relates to an apparatus that generates on-chip clock without external components, such as a crystal.

Clock generators play a critical role in modern integrated circuits. The stability of the clock is key to the performance of other systems on the IC that use the clock. For example, the signal-to-noise ratio (SNR) of an analog to digital converter (ADC), the stability of a UART communication port, and variation of power consumption at different temperatures and power supply voltages of a CPU are all subject to the stability of the clocks that drive them. Typically, a combination of a phase locked loop (PLL) and an off-chip crystal, which has high stability, is utilized to generate a highly stable clock for an IC. But the size of the crystal is often unacceptably big compared to ICs which are becoming smaller and smaller, in particular for applications that are limited by their PCB areas.

Fully on-chip clock generators are popular for ICs that emphasize small package size. Traditionally, the fully on-chip clock generator is a relaxation oscillator, which is made up of an on-chip resistor, a capacitor and active circuits such as comparators. However, the relaxation oscillator is often power hungry compared to PLL. For modern low power ICs, the relaxation oscillator often takes a large percentage of overall power consumption.

In a prior art relaxation oscillator 100, as shown in FIG. 1, a capacitor C1 must be charged and discharged at an output clock frequency $F_{clk}$. The two comparators 101 and 102 must make decisions in a time period much less than $T_{clk}=1/F_{clk}$ to keep the temperature drift of $F_{clk}$ low. Both make power consumption of the relaxation oscillator high.

Therefore, it would be desirable to provide a fully on-chip clock generator which does not require an external crystal and is power efficient.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

A fully on-chip clock generator on an integrated circuit ("IC") comprises a frequency detector for receiving a reference current and providing a first voltage; an error integrator for receiving the first voltage from the frequency detector, comparing it with a reference voltage, and providing a control voltage; a voltage controlled oscillator ("VCO") for receiving the control voltage from the error integrator, and providing an output clock; and a logic controller on the IC, coupled between the VCO and the frequency detector, and generating logic control signals for controlling the frequency detector. The fully on-chip clock generator requires no external crystal, but its power consumption is significantly lower than a relaxation oscillator that generates the same clock frequency.

Figure 2:
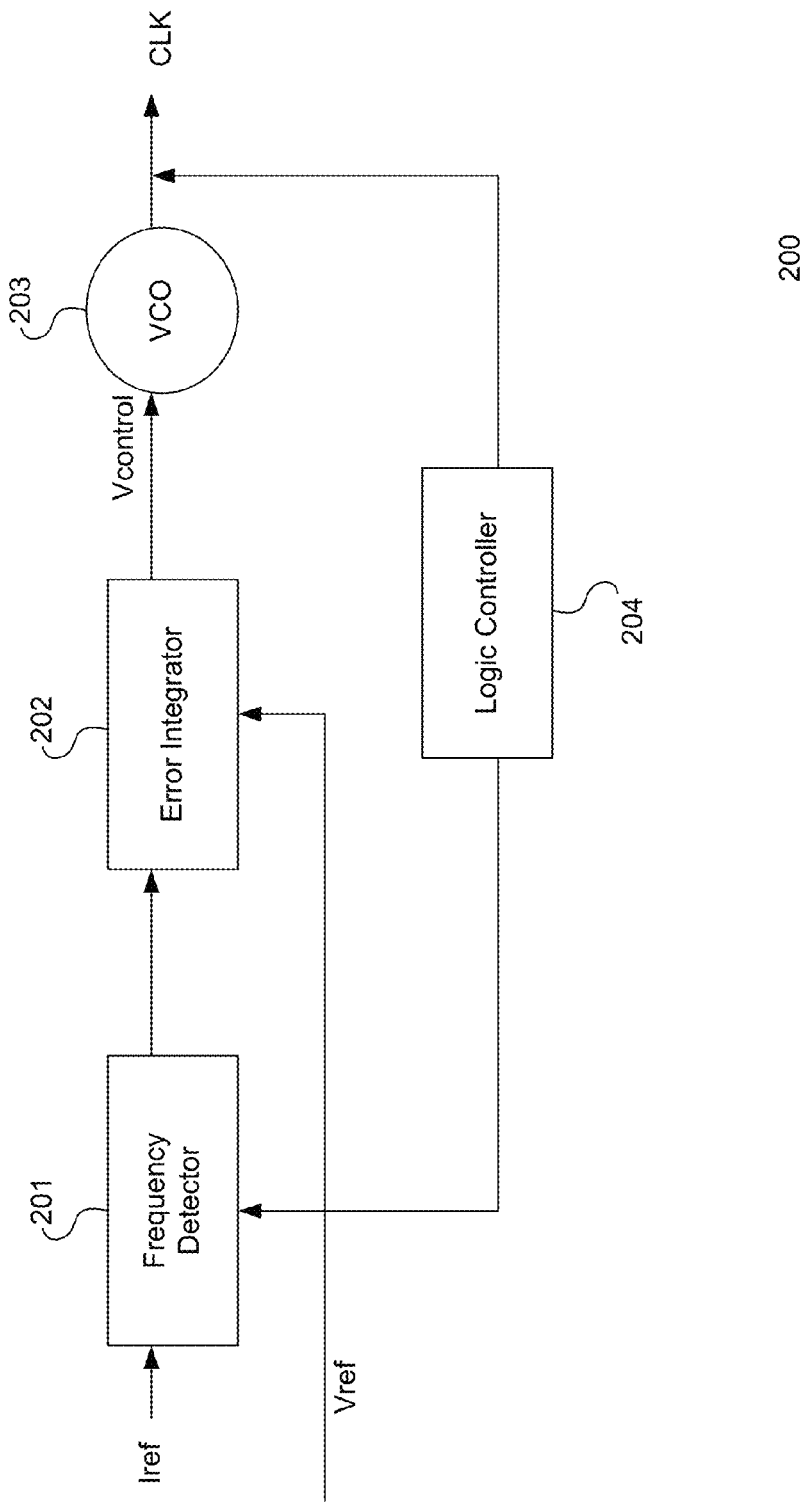
FIG. 2 shows a fully on-chip clock generator according to one embodiment of the present invention.

FIG. 2 shows a fully on-chip clock generator according to one embodiment of the present invention. The clock generator 200 may comprise a frequency detector 201, an error integrator 202 and a voltage controlled oscillator ('VCO') 203 coupled in series between an input reference current $I_{ref}$ and an output clock CLK, and a logic controller 204 in a feedback loop between the VCO 203 and the frequency detector 201.

The VCO 203 may receive a control voltage $V_{control}$ from the error integrator 202 and generate an output clock CLK in response to $V_{control}$. The VCO 203 may be any commercially available VCO.

Figure 3:
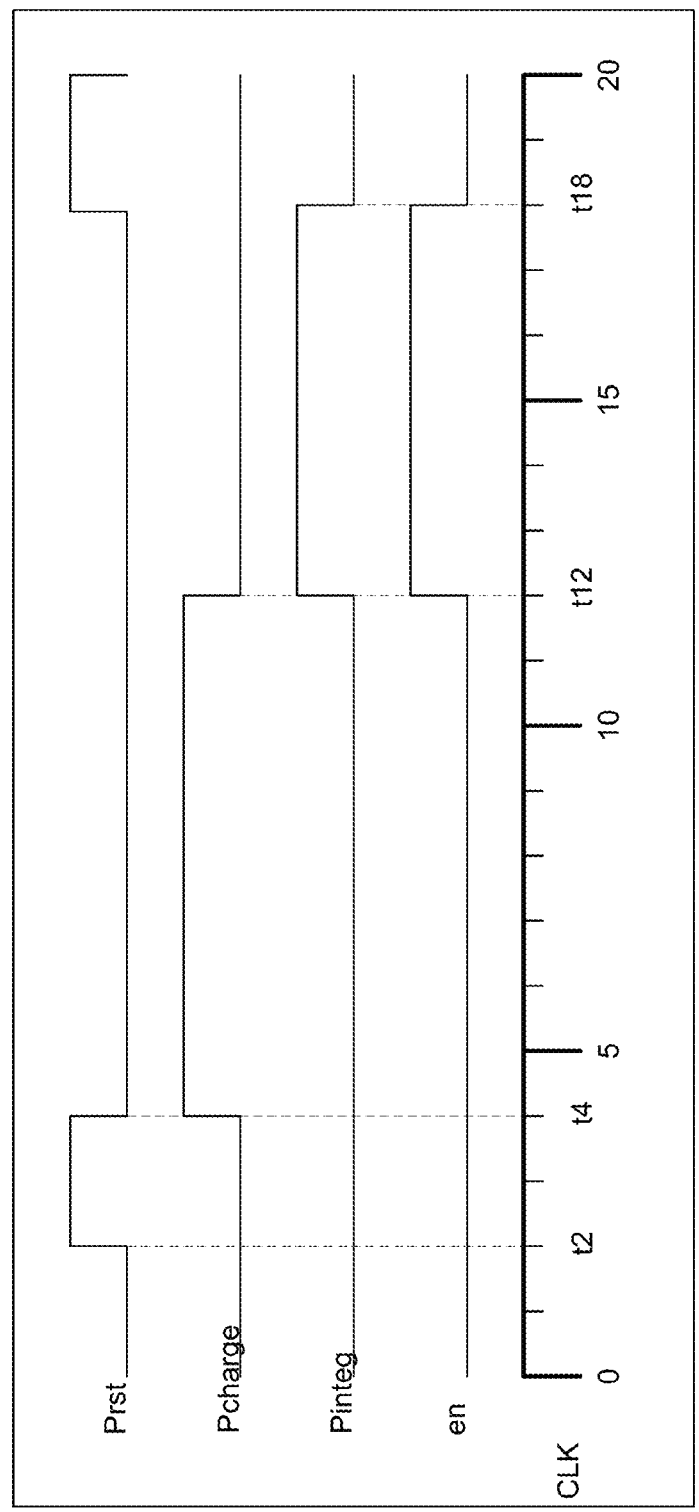
FIG. 3 shows the control signals generated by the logic control circuit 204 in the fully on-chip clock generator in FIG. 2 according to one embodiment of the present invention.

The logic control circuit 204 may receive the output clock CLK from the VCO 203, divide it down, and generate logic control signals to be used by the frequency detector 201. FIG. 3 shows the control signals generated by the logic control circuit 204 according to one embodiment of the present invention. The signals $P_{rst}$, $P_{charge}$, $P_{integ}$, en and CLK will be discussed below with reference to the operation of the fully on-ship clock generator of the present invention.

Figure 4:
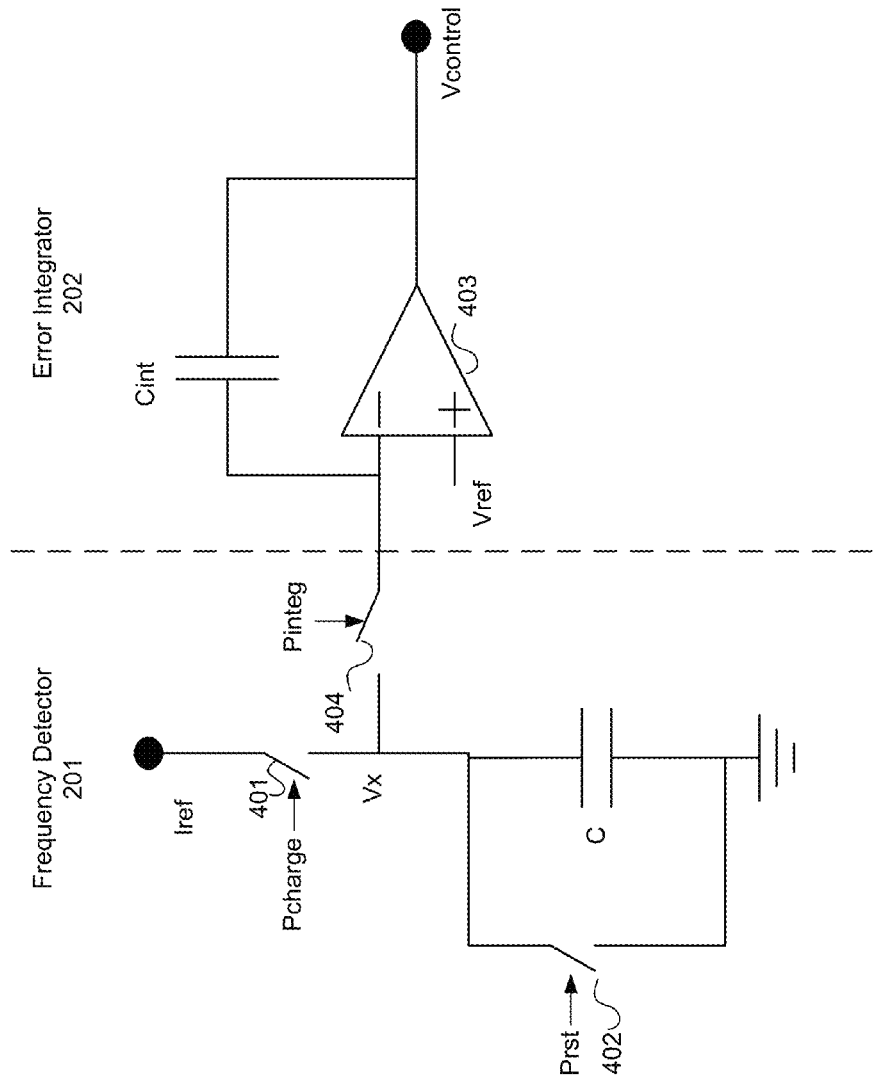
FIG. 4 shows an exemplary circuit of the frequency detector 201 and the error integrator 202 in the fully on-chip clock generator in FIG. 2 according to one embodiment of the present invention.

FIG. 4 shows an exemplary circuit of the frequency detector 201 and the error integrator 202 according to one embodiment of the present invention. The circuit in FIG. 4 may receive a reference current $I_{ref}$, compare a voltage $V_X$ with a reference voltage $V_{ref}$, and adjust the control voltage $V_{control}$ of the VCO 203 according to the result of comparison.

The frequency detector 201 may comprise a first switch 401, a second switch 401, a capacitor, and a switch 401. The first switch 401 and the capacitor C may be coupled in series in a current path that receives the reference current $I_{ref}$, and the second switch 402 may be coupled in parallel with the capacitor C. The voltage $V_x$ may be taken from an intermediate node between the first switch 401 and the capacitor C and input to the error integrator 202.

The error integrator 202 may include a power amplifier 403. It may receive a voltage Vx from the frequency detector 201 at its negative input via a switch 404, receive a reference voltage Vref at its positive input, and provide a control voltage Vcontrol at its output to control the VCO 203 (FIG. 2An integrating capacitor Cint may be coupled between the power amplifier 403's output and negative input.

The three switches 401, 402 and 404 may be controlled by the 3-phase non-overlapping control signals $P_{charge}/P_{rst}$ and $P_{integ}$ in FIG. 3, which are generated by the logic control circuit 204 in response to the clock signal CLK from the VCO 203.

At t2, an operation cycle may start. The signal $P_{rst}$ may turn high to turn on the switch 402 to start a reset phase, during which the capacitor C may be shorted to the ground while the switch 401 remains open because signal $P_{charge}$ may remain low.

At t4, the signal $P_{rst}$ may turn low to turn off the switch 402, and the signal $P_{charge}$ may turn high to turn on the switch 401 to start a charging phase, during which the reference current $I_{ref}$ may charge the capacitor C to a voltage $V_x$. The period of the charging phase and the voltage V may carry information about the VCO 203 output frequency.

At t12, the signal $P_{charge}$ may turn low to turn off the switch 402, the signal $P_{integ}$ may turn high to turn on the switch 404 to start an integrating phase, during which the error integrator 202 may force the voltage $V_x$ back to the reference voltage $V_{ref}$ such that charge $Q=(V_x-V_{ref})*C$, which may correspond to an error, is delivered to the integrating capacitor $C_{int}$. Specifically, if $V_x>V_{ref}$, the control voltage $V_{control}$ may be low. The feedback loop may force the charge on the capacitor C to move to the integrating capacitor $C_{int}$ to increase $V_{control}$ until $V_x=V_{ref}$. If $V_x<V_{ref}$, the control voltage $V_{control}$ may be high. The feedback loop may force the charge on the integrating capacitor $C_{int}$ to move to the capacitor C to decrease $V_{control}$ until $V_x=V_{ref}$.

In one embodiment, $P_{charge}$ in FIG. 3 may represent 8 clock cycles, $V_x=I_{ref}*8T_{clk}/C$, where $I_{ref}=V_{ref}/R$. If the frequency $F_{clk}$ of the VCO output clock CLK is lower than 8/RC, then $V_x$ is higher than $V_{ref}$. In the integrating phase, $V_{control}$, the output of the error integrator 202, may be forced lower to allow charge transfer. The VCO 203 may be designed such that its output frequency is higher with a lower control voltage (or negative gain). Since the control voltage $V_{control}$ is forced lower, the VCO 203 may output a clock with a higher frequency. Similarly, for a VCO frequency higher than 8/RC, the error integrator 202 may output a higher $V_{control}$ and the VCO 203 may output a lower frequency. The process may repeat until the frequency $F_{clk}$ of the VCO output clock CLK is equal to 8/RC, or in other words, until the loop is locked to the frequency 8/RC.

Figure 5:
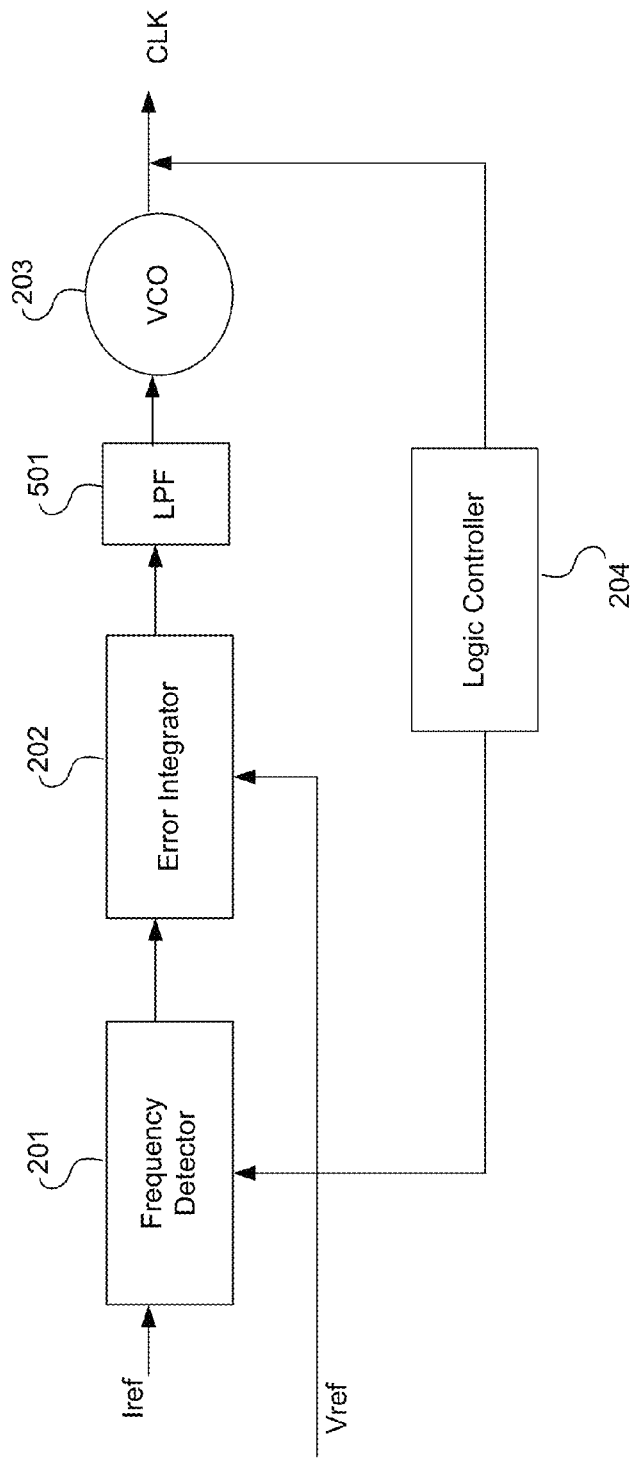
FIG. 5 shows a fully on-chip clock generator according to one embodiment of the present invention.

FIG. 5 shows a fully on-chip clock generator according to one embodiment of the present invention. In some applications, switching of MOS transistors in the frequency detector 201 and the error integrator 202 may bring ripples to the control voltage $V_{control}$ and, therefore, a low pass filter 501 may be placed between the output of the error integrator 202 and the input of the VCO 203 to suppress ripples and provide better jitter performance.

Figure 6:
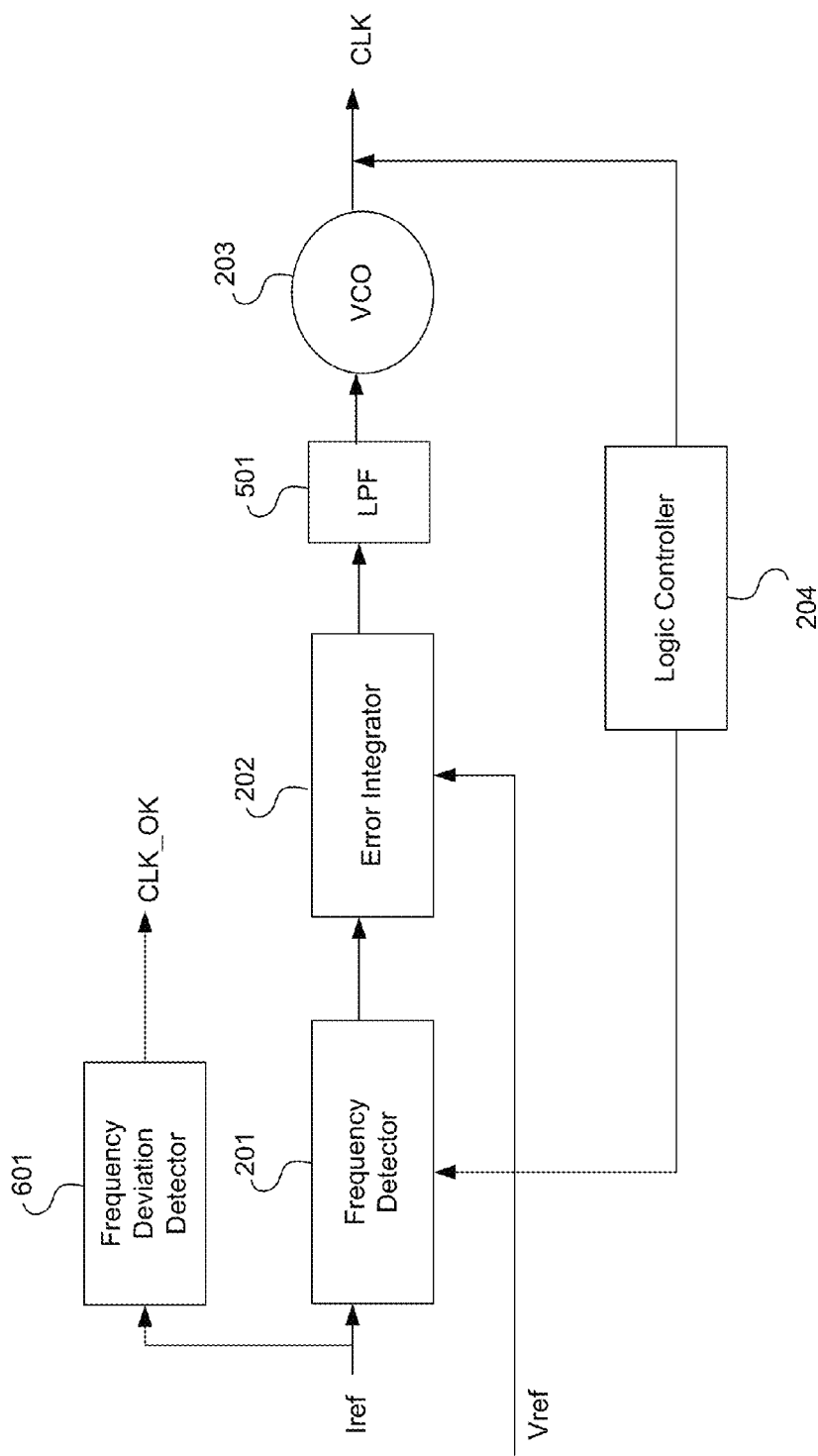
FIG. 6 shows a fully on-chip clock generator according to one embodiment of the present invention.

FIG. 6 shows an on-chip clock generator 600 according to another embodiment of the present invention. The clock generator 600 may include a frequency deviation detector 601 that detects a deviation of the frequency $F_{clk}$ of the VCO clock output CLK from an expected value due to inferences. The frequency deviation detector 601 may generate a flag CLK_OK representing status of the clock signal, so as to inform other components in a system using CLK, e.g., a CPU, whether the clock signal has an error. The clock frequency deviation detection circuit 601 may be coupled to the input of the frequency detector 201.

Figure 7:
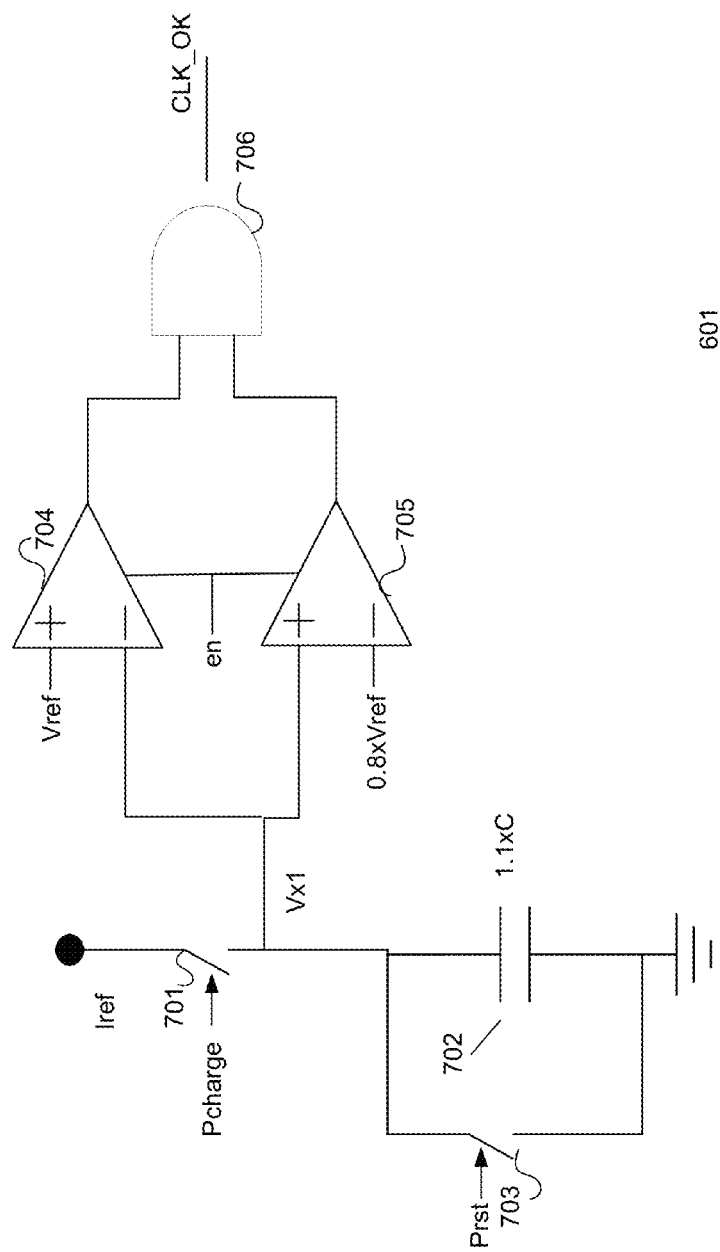
FIG. 7 shows an exemplary circuit of a clock frequency deviation detection circuit 601 in the fully on-chip clock generator shown in FIG. 6 according to one embodiment of the present invention.

FIG. 7 shows an exemplary circuit of a clock frequency deviation detection circuit 601 in the fully on-chip clock generator shown in FIG. 6 according to one embodiment of the present invention. The clock frequency deviation detection circuit 601 may comprise a first switch 701 and a capacitor 702 coupled in series in a current path that receives the reference current $I_{ref}$ and a second switch 703 coupled in parallel with the capacitor 702. A voltage $V_{x1}$ may be taken from an intermediate node between the first switch 701 and the capacitor 702 and input to a first comparator 704 at its negative input and a second comparator 705 at its positive input. The reference voltage $V_{ref}$ may be input to the first comparator 704 at its positive input. A second reference voltage VLO may be input to the second comparator 705 at its positive input. The frequency deviation detection circuit 601 further may include an "AND" gate 706 receiving outputs from comparators 704 and 705. The comparators 704 and 705 may be controlled by a signal en, which is shown in FIG. 3.

The clock frequency deviation detection circuit 601 (or clock OK detection) may be implemented to monitor quality of the frequency $F_{clk}$ of the VCO output clock CLK. Referring to FIG. 7, a copy of the reference current $I_{ref}$ may be used to charge the capacitor 702 which may be larger than the capacitor C in the frequency detector 201. With the same charging current $I_{ref}$ and the same charging time $P_{charge}$, the voltage level on the capacitor $V_{x1}$ should be lower than the value $V_x$ in the frequency detector 201. The comparators 704 and 705 may determine if the voltage $V_{x1}$ falls between $V_{ref}$ and VLO which may cause the AND gate 706 to generate an output representing valid operation. If the voltage on VX1 exceeds VREF or falls below VLO, then the AND gate may generate an output representing an error condition.

In an embodiment, the capacitor C1 may be set to be 10% larger than the capacitor C of FIG. 4. Further, VLO may be set to a value of about 0.8*VREF. In this embodiment, if the system is operating properly, VX1 should be about 0.9*Vx.

If $V_{x1}>V_{ref}$, the output of the comparator 704 is "0", and if $V_{x1}<0.8 V_{ref}$, the output of the comparator 705 is "0". The signal CLK_OK, the output of the "AND" gate 706, is "0" whenever the output of the comparator 704 or the comparator 705 is "0", indicating that $V_{x1}$ is out of an expected range, which may be 90%$V_{ref}$ to 110%$V_{ref}$. If $0.8V_{ref}<V_{x1}<V_{ref}$, the output of the "AND" gate is "1", indicating that the frequency $F_{clk}$ of the VCO output clock CLK falls in +/−10% of its expected value, 8/RC.

Figure 8:
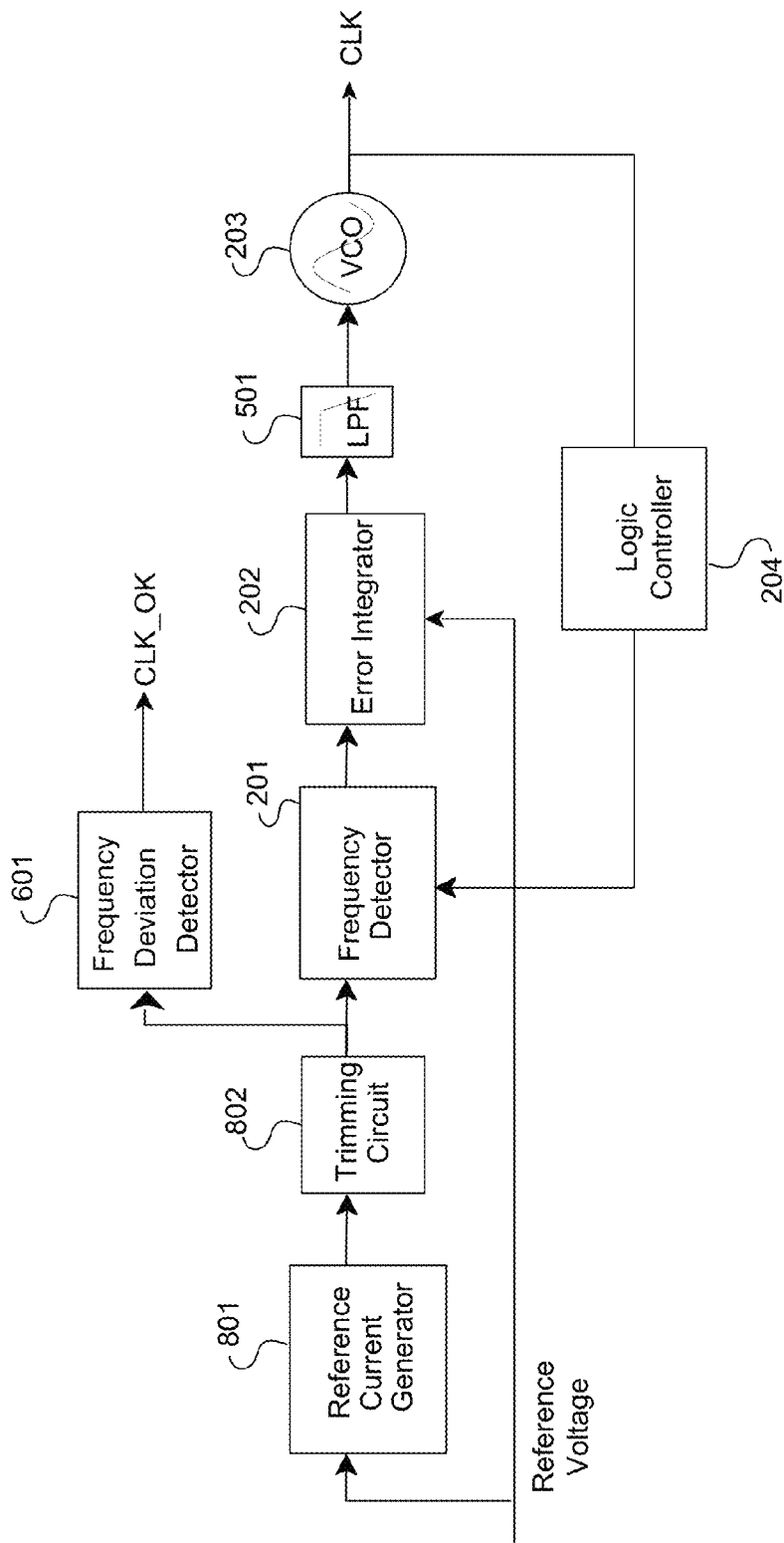
FIG. 8 shows a fully on-chip clock generator according to one embodiment of the present invention.

FIG. 8 shows a fully on-chip clock generator according to one embodiment of the present invention. A reference current generator 801 and a trimming circuit 802 may be coupled in series at the input of the frequency detector 201. The reference current generator 801 may be used to generate the reference current $I_{ref}$ used by the frequency detector 201; and the trimming circuit 802 may be used to compensate the temperature drifts of on-chip resistors and capacitors.

Figure 9:
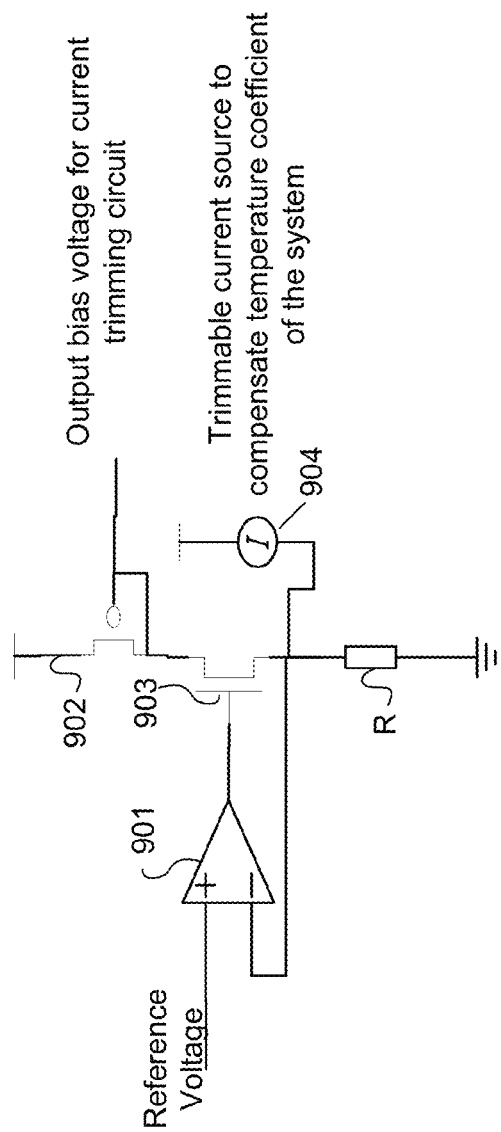
FIG. 9 shows an exemplary circuit of the reference current generator 801 in the fully on-chip clock generator in FIG. 8 according to one embodiment of the present invention.

FIG. 9 shows an exemplary circuit of a reference current generator 801. The reference current generator 801 may generate an output bias voltage for a current trimming circuit 802 in response to the reference voltage $V_{ref}$, so that the current trimming circuit 802 may generate the reference current $I_{ref}$ for the frequency detector 201. As shown in FIG. 9, a power amplifier 901 may receive the reference voltage $V_{ref}$ at one of its inputs, e.g., its negative input, and output a voltage to the gate of an NMOS 903 to drive the NMOS. The source of the NMOS 903 may be grounded via a resistor R. The drain of the NMOS 903 may be coupled to the drain of a PMOS 902, which is a current mirror of the NMOS 903. A trimmable current source 904 may be coupled between a fixed voltage and the drain of the NMOS 903 to compensate temperature coefficient of the system. The source of the PMOS 902 may be coupled to a fixed voltage. The gate and drain of the PMOS 902 may be coupled together and a bias voltage for the current trimming circuit 802 may be taken from the gate of the PMOS 902.

Figure 10:
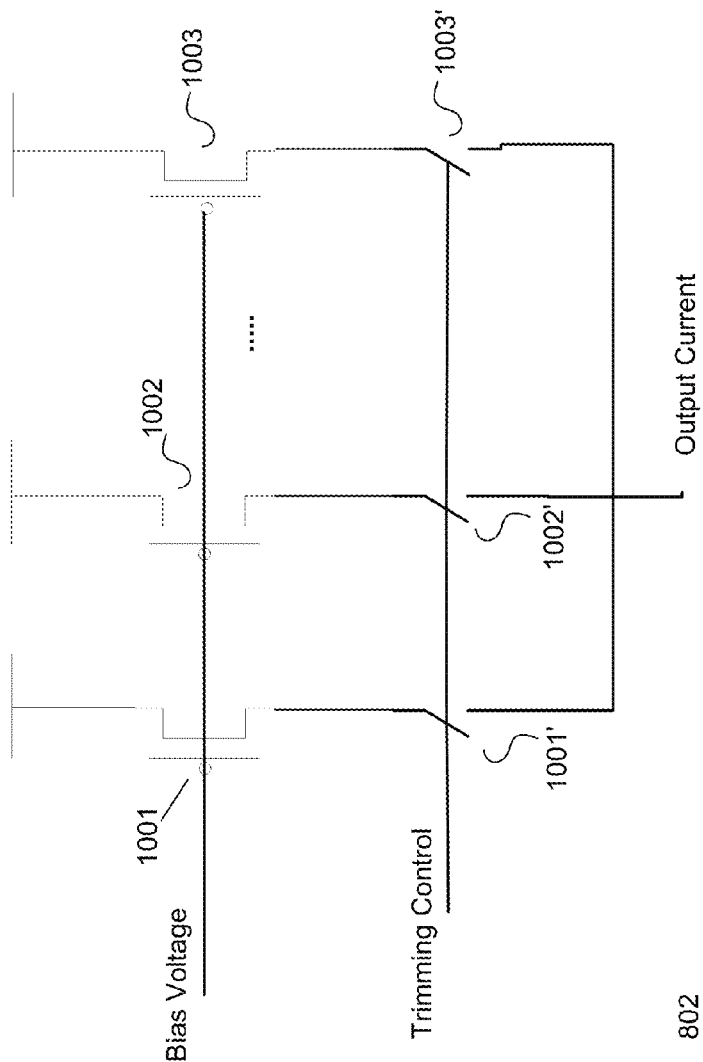
FIG. 10 shows an exemplary circuit of the current trimming circuit 802 in the fully on-chip clock generator in FIG. 8 according to one embodiment of the present invention.

FIG. 10 shows an exemplary circuit of a current trimming circuit 802. The current trimming circuit 802 may generate the reference current $I_{ref}$ for the frequency detector 201 in response to the bias voltage from the reference current generator 801. The current trimming circuit 802 may comprise a number of circuit branches coupled in parallel between a fixed voltage and the output of the current trimming circuit 802. The first circuit branch may have a PMOS 1001 and a switch 1001' coupled in series; the second circuit branch may have a PMOS 1002 and a switch 1002' coupled in series; and the third circuit branch may have a PMOS 1003 and a switch 1003' coupled in series. The gates of PMOSes 1001, 1002 and 1003 may be coupled to the output of the reference current generator 801 to receive the bias voltage; and the switches 1001', 1002' and 1003' may be controlled by a trimming control signal.

Since the frequency $F_{clk}$ of the VCO output clock CLK in FIG. 2 equals to 8/RC, its temperature drift may be dominated by the drift of RC. In the reference current generator 801 (see FIG. 9), a tunable current source 904 with a predefined temperature drift coefficient is injected on top of the resistor R to compensate the drift of R. The temperature drift of the capacitor C (see FIG. 4) may also be compensated by over compensating the drift of R.

Figure 11:
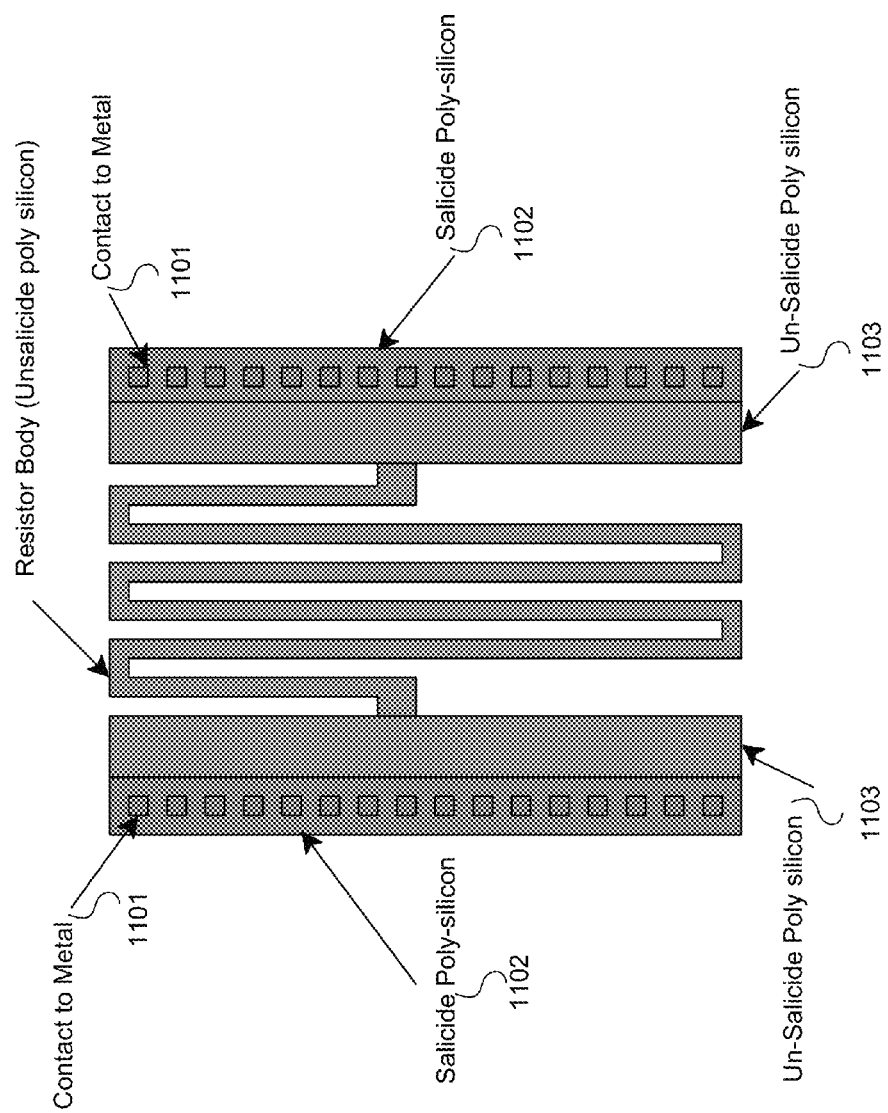
FIG. 11 shows an exemplary shape of the poly resistor according to one embodiment of the present invention.

In one embodiment of the present invention, R may be implemented by a poly silicon film in the CMOS process, and its temperature coefficient may rely on its shape. A special resistor shape may be developed to make the temperature coefficient of R lower than the standard shape, which in turn may enable higher resolution in drift compensation. The optimization is based on the fact that the salicide area of a poly resistor suffers far higher temperature drift than its un-salicide area. FIG. 11 shows an exemplary shape of the poly resistor.

Figure 12:
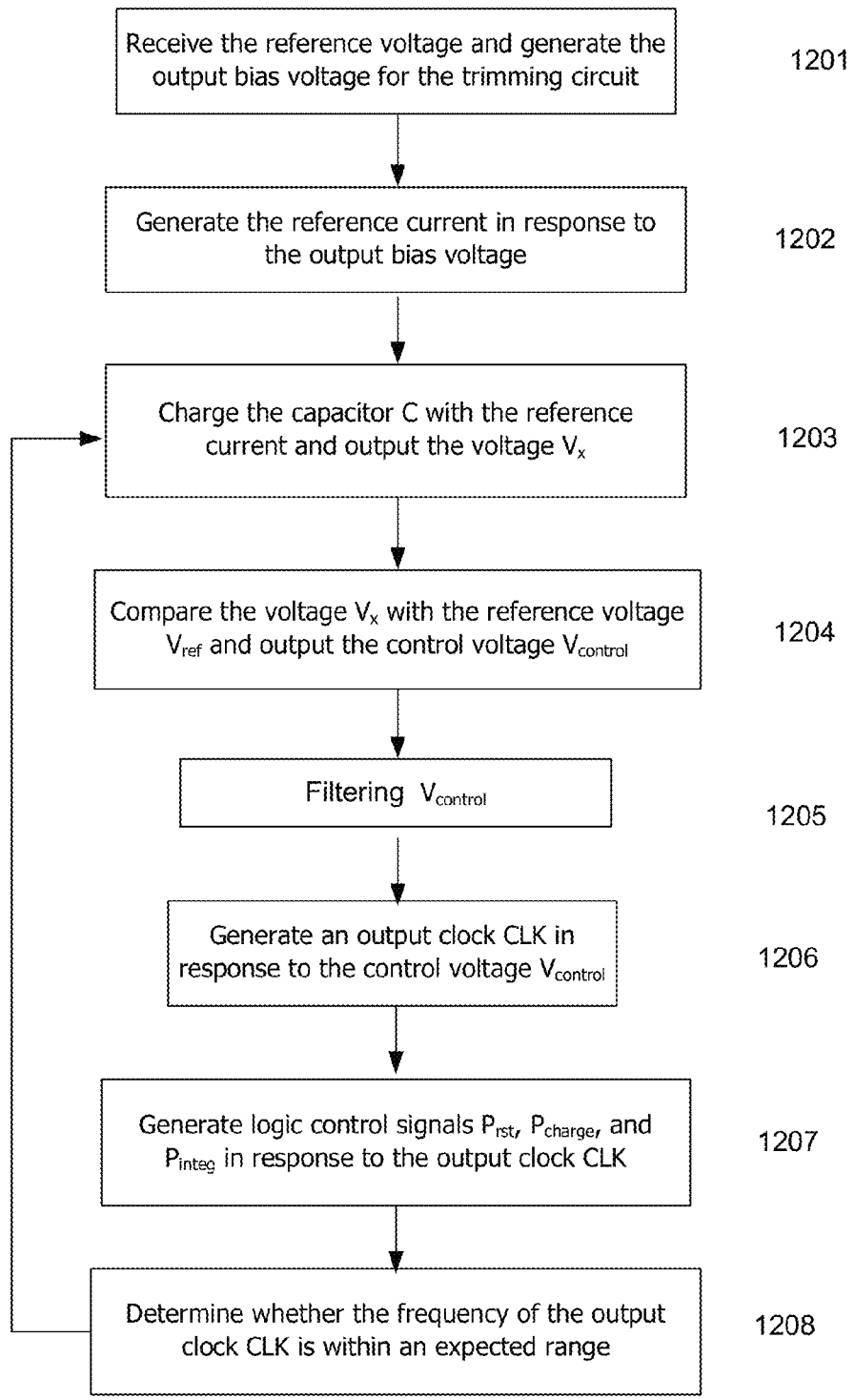
FIG. 12 illustrates a flowchart of a method for generating a clock for an integrated circuit with only on-chip components.

FIG. 12 illustrates a flowchart of a method for generating a clock for an integrated circuit with only on-chip components according to one embodiment of the present invention. The method is described with reference to FIGS. 2-10.

At 1201, the reference current generator 801 may receive the reference voltage and generate the output bias voltage for the trimming circuit 802.

At 1202, the trimming circuit 802 may generate the reference current in response to the output bias voltage from the reference current generator.

At 1203, the frequency detector 201 may be controlled by the logic control signals $P_{rst}$, $P_{charge}$, and $P_{integ}$ from the VCO 203 to discharge the capacitor C, charge the capacitor C with the reference current and output the voltage $V_x$.

At 1204, the error integrator 202 may compare the voltage $V_x$ with the reference voltage $V_{ref}$ and output the control voltage $V_{control}$.

At 1205, the control voltage $V_{control}$ may be filtered by a low pass filter 501.

At 1206, the VCO 203 may generate an output clock CLK in response to the control voltage $V_{control}$.

At 1207, the logic controller 204 may generate logic control signals $P_{rst}$, $P_{charge}$, and $P_{integ}$ in response to the output clock CLK to control the frequency detector 201.

At 1208, the frequency deviation detect circuit 601 may determine whether the frequency of the output clock CLK is within an expected range and flag it.

The procedure may then return to 1203.

Figure 1:
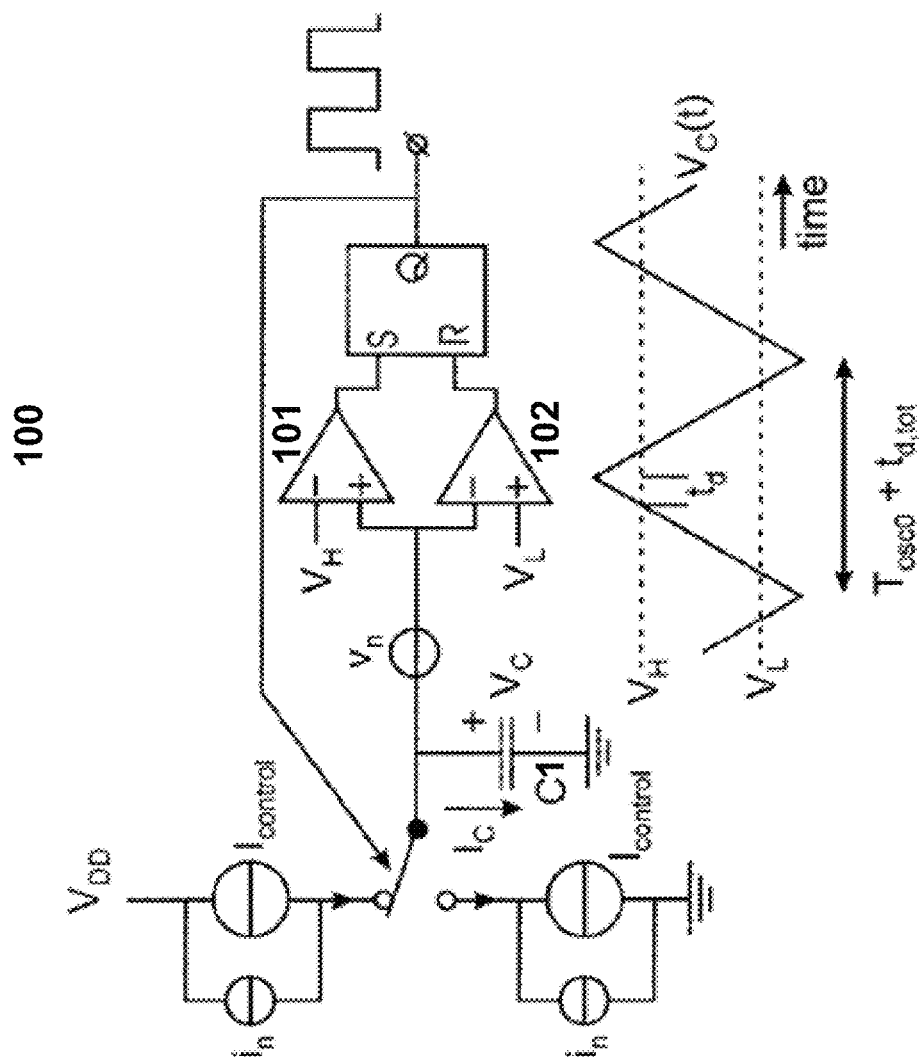
FIG. 1 shows a prior art relaxation oscillator.

In contrast with the relaxation oscillator 100 in FIG. 1, the fully on-chip oscillators of the present invention, as those shown in FIGS. 1-10, may have their VCOs operate at $F_{clk}$. Since $P_{charge}$ may take 8 clock cycles, the capacitor C in the frequency detector 201 is charged and discharged at ⅛ of $F_{clk}$, which consumes much less power compared to the relaxation oscillator 100. On the other hand, during the integrating phase, $P_{integ}$ may take 6 clock cycles so that the integrator only needs to settle in ⅙ of $F_{clk}$, which may also saves significant power compared to the two comparators 101 and 102 in the prior art relaxation oscillator 100. The embodiments only use 8 clock cycles and 6 clock cycles as examples. It should be understood that clock cycles of $P_{charge}$ and $P_{integ}$ may be other numbers, as long as they are not smaller than 3.

Compared to a typical relaxation oscillator, the present invention may achieve the same performance with ⅓~¼ of the power consumption. In one embodiment, the present invention provides 16 MHz clock with 0.1 mA Idd while the relaxation oscillator requires 0.35 mA. For a system that targets 1 mA overall Idd, such difference is vital.

This invention may achieve better temperature drift by optimizing resistor shape that defines output frequency. With the optimized resistor layout, 12 ppm/° C. temperature drift after trimming is achievable, which results in 0.2% frequency variation across −40° C.~125° C. temperature range.

One embodiment is a 16 MHz oscillator based on 0.18 um CMOS process but it can easily leverage to other frequency by tuning the VCO center frequency.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A clock generator on an integrated circuit ("IC"), comprising:
   a frequency detection, receiving a reference current and providing a first voltage;
   an error integrator, receiving the first voltage from the frequency detector, comparing it with a reference voltage, and providing a control voltage;
   a voltage controlled oscillator ("VCO"), receiving the control voltage from the error integrator and providing an output clock;
   a logic control circuit, generating logic control signals for controlling the frequency detector based on the output clock; and
   a frequency deviation detection circuit, coupled to the input of the frequency detector and providing a signal indicating whether the frequency of the VCO output clock is within an expected range.

2. The circuit of claim 1, wherein the frequency detector comprises:

a first switch receiving the reference current at a first end;
a first capacitor, coupled between a second end of the first switch and the ground; and
a second switch, coupled in parallel with the first capacitor, wherein the first voltage is taken from the upper part of the first capacitor.

3. The circuit of claim 2, wherein the error integrator comprises:
a third switch;
a first power amplifier, receiving the first voltage at a first input via the third switch and the reference voltage at a second input, and providing the control voltage at its output; and
an integrating capacitor, coupled between the power amplifier's output and first input.

4. The circuit of claim 3, wherein the first input of the first power amplifier is its negative input, and the second input of the first power amplifier is its positive input.

5. The circuit of claim 3, wherein the logic control signals comprise: a first control signal, turning on the second switch to short the first capacitor to the ground when it turns high.

6. The circuit of claim 5, wherein the logic control signals comprise: a second control signal, turning on the first switch to charge the first capacitor when it turns high.

7. The circuit of claim 6, wherein the logic control signals comprise: a third control signal, turning on the third switch to connect the upper part of the first capacitor to the integrating capacitor to enable charge transfer.

8. The circuit of claim 1, further comprising a low pass filter ("LPF"), coupled between the error integrator and the VCO for filtering the control signal from the error integrator.

9. The circuit of claim 1, wherein the frequency deviation detection circuit comprises:
a fourth switch, receiving the reference current at a first end;
a second capacitor, coupled between a second end of the fourth switch and the ground;
a fifth switch, coupled in parallel with the second capacitor;
a first comparator, receiving a voltage at the upper part of the second capacitor at a first input of the first comparator and the reference voltage at a second input of the first comparator;
a second comparator, receiving a second reference voltage at a first input of the second comparator and the voltage at the upper part of the second capacitor at a second input of the second comparator the second reference voltage lower than the first reference voltage; and
a logic gate, receiving outputs from the first and second comparator and providing the signal indicating whether the frequency of the VCO output clock is within an expected range.

10. The circuit of claim 9, wherein the capacitance of the second capacitor is larger than that of the first capacitor.

11. The circuit of claim 10, wherein the capacitance of the second capacitor is 110% of that of the first capacitor.

12. The circuit of claim 10, wherein the second reference voltage is 80% of the reference voltage.

13. The circuit of claim 1, further comprising a reference current generator, receiving the reference voltage and providing an output bias voltage.

14. The circuit of claim 13, wherein the resistor is a poly silicon film.

15. The circuit of claim 13, wherein the reference current generator comprises:
a second power amplifier, receiving the reference voltage at one input, and providing a driving voltage at an output;
a first transistor, with its gate controlled by the driving voltage from the output of the second power amplifier;
a resistor, coupled between a drain of the first transistor and the ground;
a second transistor, with its source coupled to a fixed voltage, and its drain coupled to the source of the first transistor; and
a current source, coupled between a fixed voltage and the drain of the first transistor,
wherein the bias voltage is taken from the gate of the second transistor.

16. The circuit of claim 13, further comprising: a trimming circuit, coupled between the output of the reference current generator and the input of the frequency detector.

17. The circuit of claim 16, wherein the trimming circuit comprises a plurality of circuit branches coupled in parallel, wherein each circuit branch comprises a transistor and a switch, and wherein transistors in the circuit branches are controlled by the bias voltage from the reference current generator.

18. A method for generating a clock for an integrated circuit with only on-chip components, the method comprising:
receiving a reference current at a frequency detector;
charging a capacitor in the frequency detector with the reference current;
comparing a first voltage at the upper part of the capacitor with a reference voltage;
generating a control voltage in response to the comparison;
generating an output clock in response to the control voltage;
detecting a deviation of the frequency of the output clock from its expected value;
generating a plurality of logic control signals in response to the output clock and the deviation; and
controlling the frequency detector with the logic control signals.

19. The method of claim 18, wherein the logic control signals comprise: a third control signal for enabling charge to be transferred in and out of the capacitor.

20. The method of claim 18, wherein the logic control signals comprise: a first control signal for resetting the capacitor.

21. The method of claim 18, wherein the logic control signals comprise: a second control signal for charging the capacitor.

22. The method of claim 21, wherein generating the plurality of logic control signals includes setting the first control signal high for three clock cycles, and setting the second control signal high for eight clock cycles.

23. The method of claim 18, further comprising: filtering the control voltage with a low pass filter.

24. The method of claim 18, further comprising: generating an output bias voltage in response to a reference voltage.

25. The method of claim 24, further comprising: generating the reference signal in response to the output bias voltage.

* * * * *